(12) United States Patent
Chang

(10) Patent No.: US 8,221,135 B2
(45) Date of Patent: Jul. 17, 2012

(54) SOCKET CONNECTOR HAVING RESILIENT POSITIONING MEMBER SECURING IC PACKAGE THEREIN

(75) Inventor: Chun-Yi Chang, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 159 days.

(21) Appl. No.: 12/759,631

(22) Filed: Apr. 13, 2010

(65) Prior Publication Data

US 2010/0261372 A1 Oct. 14, 2010

(51) Int. Cl.
*H01R 12/00* (2006.01)
(52) U.S. Cl. ......................................................... 439/71
(58) Field of Classification Search ............... 439/71, 439/70, 525, 526
See application file for complete search history.

(56) References Cited

U.S. PATENT DOCUMENTS

| | | | | |
|---|---|---|---|---|
| 4,354,720 A * | 10/1982 | Bakermans | ................... | 439/357 |
| 4,427,249 A * | 1/1984 | Bright et al. | ................... | 439/68 |
| 4,433,886 A * | 2/1984 | Cassarly et al. | ................ | 439/65 |
| 4,511,201 A * | 4/1985 | Baker et al. | ................... | 439/260 |
| 4,703,920 A * | 11/1987 | Grabbe et al. | ................... | 269/37 |
| 4,783,719 A * | 11/1988 | Jamison et al. | ................ | 361/751 |
| 5,066,245 A * | 11/1991 | Walker | ........................... | 439/526 |
| 5,127,837 A * | 7/1992 | Shah et al. | ...................... | 439/71 |
| 5,221,209 A * | 6/1993 | D'Amico | ......................... | 439/71 |
| 5,282,111 A * | 1/1994 | Hopfer | ........................... | 361/704 |
| 5,568,057 A * | 10/1996 | Kim et al. | ................. | 324/756.02 |
| 5,648,893 A * | 7/1997 | Loo et al. | ...................... | 361/820 |
| 6,112,901 A * | 9/2000 | Noga et al. | ..................... | 206/723 |
| 6,132,220 A * | 10/2000 | McHugh et al. | ................ | 439/66 |
| 6,196,849 B1 * | 3/2001 | Goodwin | ......................... | 439/71 |
| 6,644,981 B2 * | 11/2003 | Choy | .............................. | 439/70 |
| 6,780,056 B1 | 8/2004 | Neidich | | |
| 6,796,805 B2 * | 9/2004 | Murr | ................................ | 439/71 |
| 6,805,562 B2 * | 10/2004 | Liao et al. | ....................... | 439/68 |
| 6,848,936 B2 * | 2/2005 | DeFord | ............................ | 439/526 |
| 6,872,592 B2 * | 3/2005 | D'Amato et al. | ............. | 438/106 |
| 6,877,993 B2 * | 4/2005 | Palaniappa et al. | ............. | 439/73 |
| 6,908,316 B2 * | 6/2005 | Ma et al. | ......................... | 439/73 |
| 6,918,779 B2 * | 7/2005 | Liao | ............................... | 439/342 |
| 6,929,505 B2 * | 8/2005 | He et al. | .......................... | 439/526 |
| 7,118,385 B1 * | 10/2006 | Bodenweber et al. | .......... | 439/71 |
| 7,371,098 B2 | 5/2008 | Wang et al. | | |
| 7,510,402 B2 * | 3/2009 | Ma et al. | ......................... | 439/71 |
| 7,527,503 B1 * | 5/2009 | Polnyi | ............................. | 439/71 |
| 7,614,885 B2 * | 11/2009 | Liao et al. | ....................... | 439/71 |
| 7,651,367 B2 * | 1/2010 | Chang et al. | .................. | 439/526 |
| 7,654,862 B2 * | 2/2010 | Liao et al. | ..................... | 439/526 |
| 7,682,160 B2 * | 3/2010 | Liao | ................................ | 439/71 |
| 7,862,349 B1 * | 1/2011 | Takahashi et al. | .............. | 439/91 |
| 7,871,275 B1 * | 1/2011 | McClellan et al. | ............. | 439/71 |
| 7,883,349 B2 * | 2/2011 | Yeh et al. | ........................ | 439/325 |
| 7,887,356 B1 * | 2/2011 | Cheng et al. | .................. | 439/331 |

(Continued)

*Primary Examiner* — Neil Abrams
(74) *Attorney, Agent, or Firm* — Andrew C. Cheng; Wei Te Chung; Ming Chieh Chang

(57) ABSTRACT

A socket connector includes a socket body and a plurality of contact terminals received in the socket body. The socket body includes an upper surface, a plurality of sidewalls extending upwardly from the upper surface. The upper surface and the sidewalls jointly define a cavity for receiving an IC package therein. At least one of the sidewalls is provided with a resilient arm having two ends connected to the sidewall and a close-loop slot behind the resilient arm. The resilient arm is provided with a positioning member extending toward the cavity.

20 Claims, 6 Drawing Sheets

U.S. PATENT DOCUMENTS

| | | | |
|---|---|---|---|
| 2004/0175986 A1* | 9/2004 | Liao et al. | 439/526 |
| 2005/0095906 A1* | 5/2005 | He et al. | 439/526 |
| 2005/0196982 A1* | 9/2005 | Cao et al. | 439/70 |
| 2010/0142895 A1* | 6/2010 | Hsu | 385/75 |

* cited by examiner

SOCKET CONNECTOR HAVING RESILIENT POSITIONING MEMBER SECURING IC PACKAGE THEREIN

BACKGROUND OF THE INVENTION

1. Field of the Invention

The present invention relates to a socket connector, and more particularly to a socket connector having a resilient positioning member securing an IC package therein.

2. Description of Related Art

Connectors are used for a number of applications. In one such application that occurs commonly in a computer system, a socket connector is provided to be mounted on a mother board for receiving an IC (Integrated Circuit) package. The socket connector generally comprises at least a socket body and an array of contact terminals mounted within the socket body. An IC package is placed onto the socket body and then brought into contact with the contact terminals in the socket body. The contact terminals are also electrically connected onto conductive pads disposed on the mother board, respectively, such that the electrical connection between the IC package and the circuit in the mother board is achieved.

U.S. Pat. No. 6,780,056 issued to Neidich on Aug. 24, 2004 discloses a socket connector performing such a function as described above. Particularly referring to FIGS. 1-3 of Neidich, the socket connector includes a rectangular socket body having an upper surface and four sidewalls. The upper surface and sidewalls corporately define a cavity for receiving and securing the IC package. To ensure a fine and true positioning of the IC package, each side wall is provided with a pair of cantilevered arms extending oppositely and respectively having a pushing section at the free end thereof When the IC package is placed into the cavity, the cantilevered arm deflect resiliently and the pushing sections engage the edges of the IC package and apply a pushing force on the IC package, such that the IC package is stably retained.

However, the typical conventional cantilever design of the resilient arm is inherited with vulnerable intensity and elasticity, which may result in breakage of the cantilevered arm in worst scenario. Moreover, since the cantilevered arm rotates centered with a pivotal point, the positioning member is improper to be configured with a planar engaging face that directly touches the IC package. Specially referring to FIG. 3 of Neidich, the engaging face thereof is a substantially arc one instead, with a sharp tip engaging the edge of the IC package. Because of the quite small amount of the engaging area between the positioning member and the IC package, the performance and effect of the positioning member is reduced.

SUMMARY OF THE INVENTION

Accordingly, an object of the present invention is to provide a socket connector with improved positioning members with robust intensity and elasticity.

According to one aspect of the present invention, there is provided a socket connector which includes a socket body and a plurality of contact terminals received in the socket body. The socket body includes an upper surface, a plurality of sidewalls extending upwardly from the upper surface. The upper surface and the sidewalls jointly define a cavity for receiving an IC package therein. At least one of the sidewalls is provided with a resilient arm having two ends connected to the sidewall and a close-loop slot behind the resilient arm. The resilient arm is provided with a positioning member extending toward the cavity.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
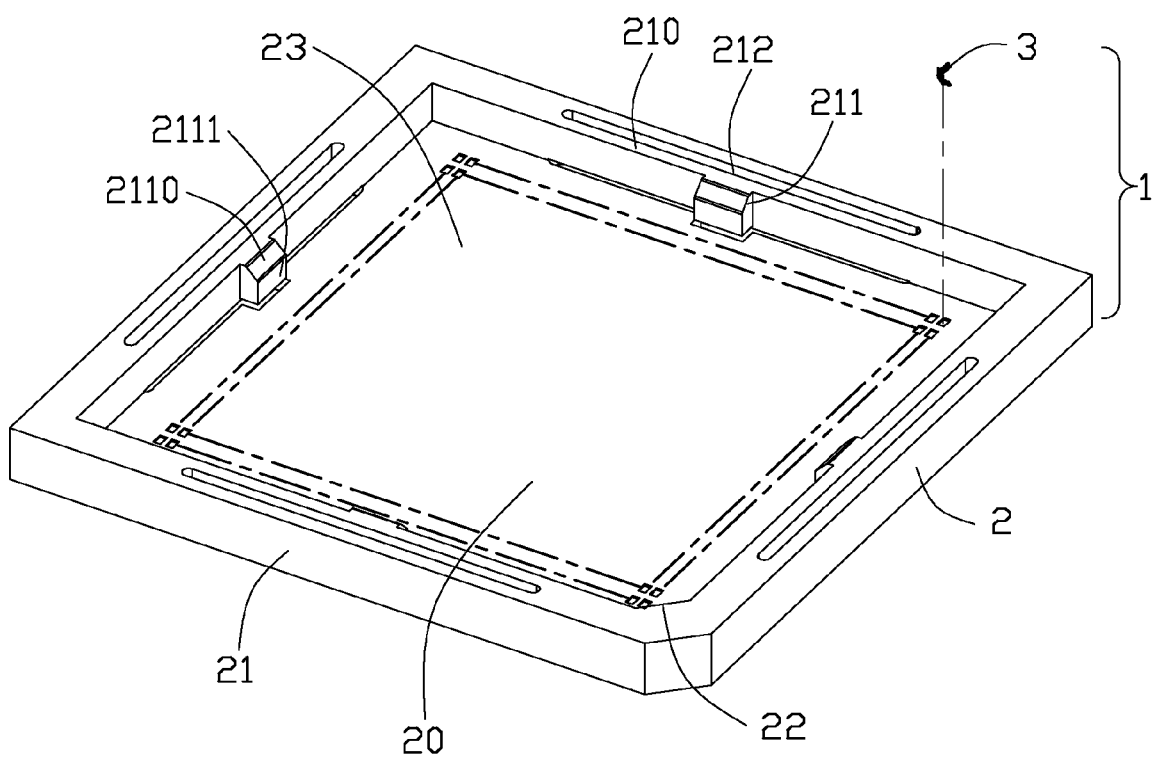
FIG. 1 is an exploded, perspective view of a socket connector in accordance with a preferred embodiment of the present invention.
Figure 2:
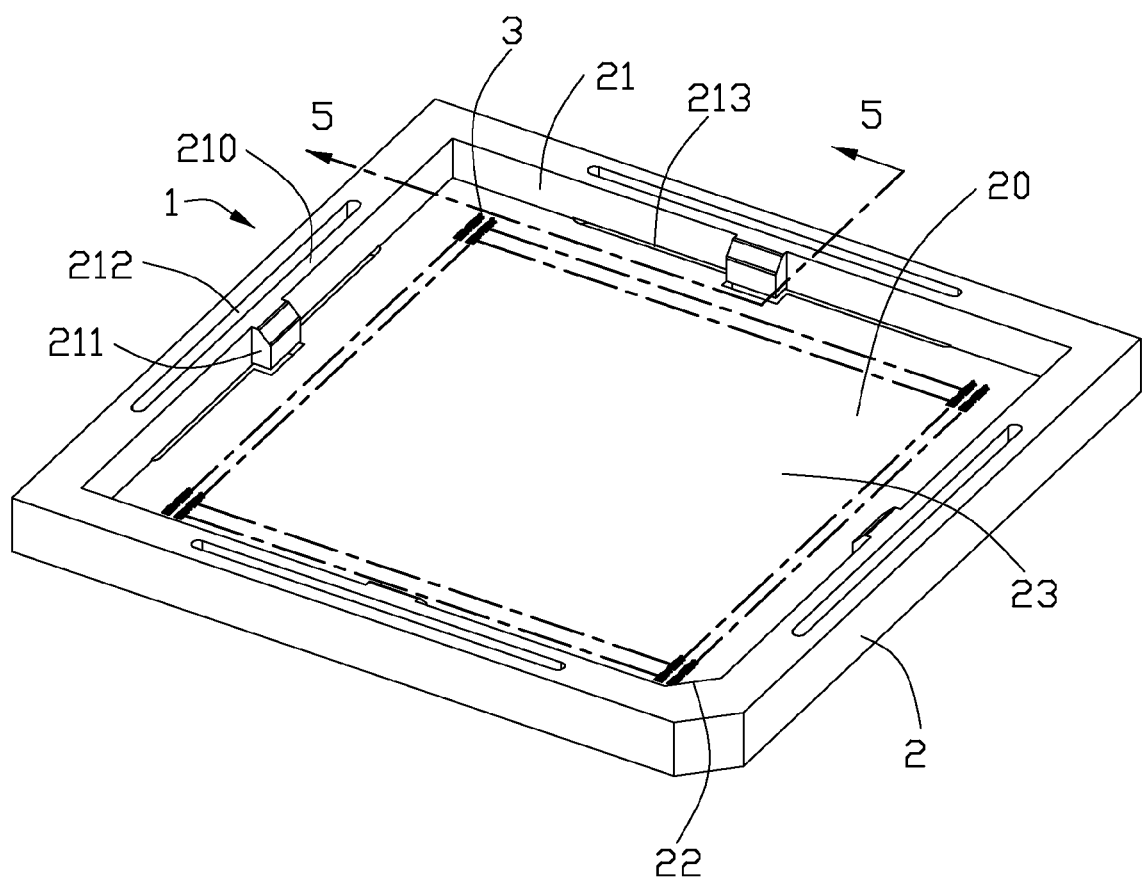
FIG. 2 is an assembled, perspective view of the socket connector shown in FIG. 1.
Figure 3:
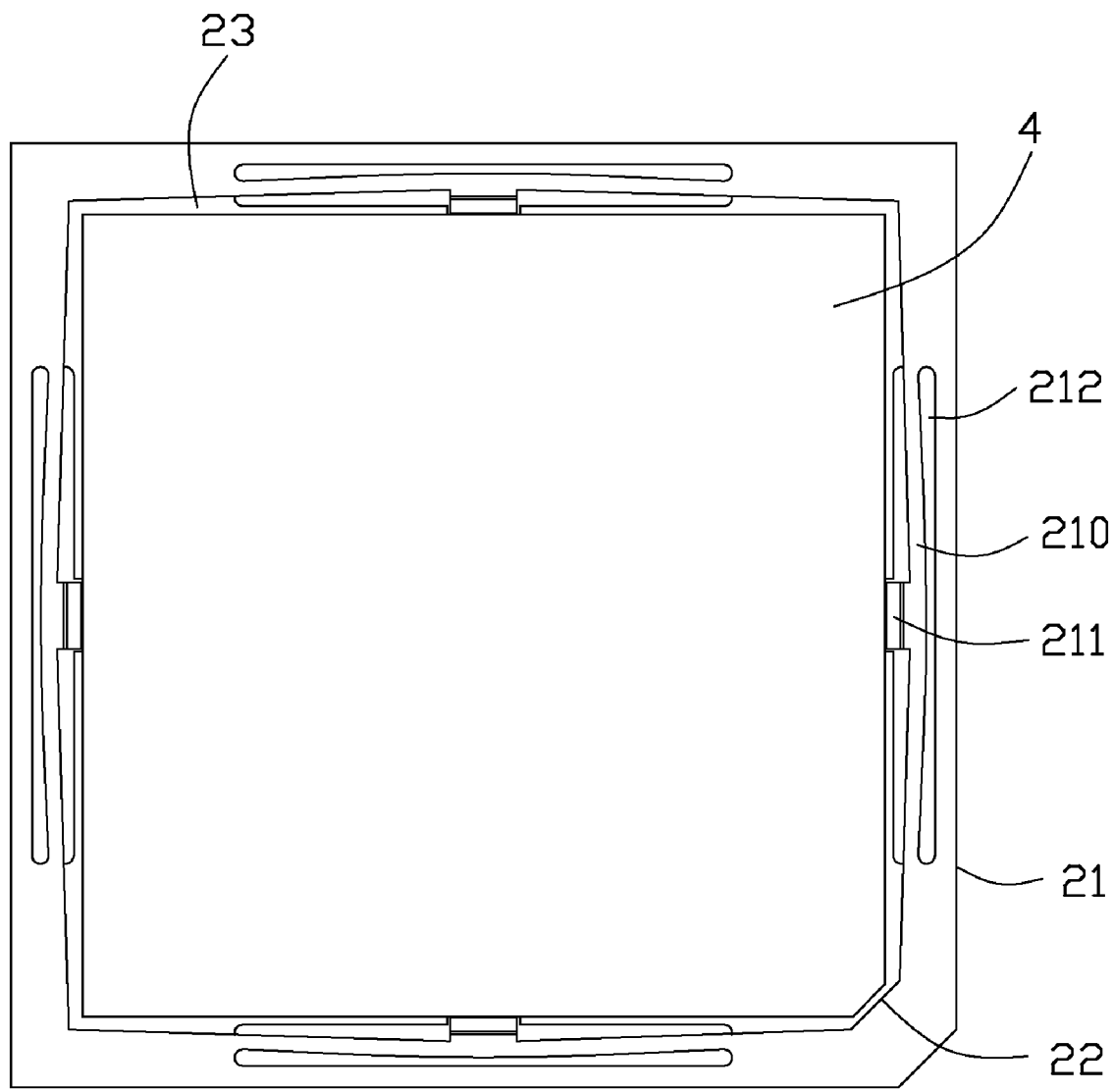
FIG. 3 is a top view of the socket connector shown in FIG. 1, wherein an IC package received therein is shown.
Figure 4:
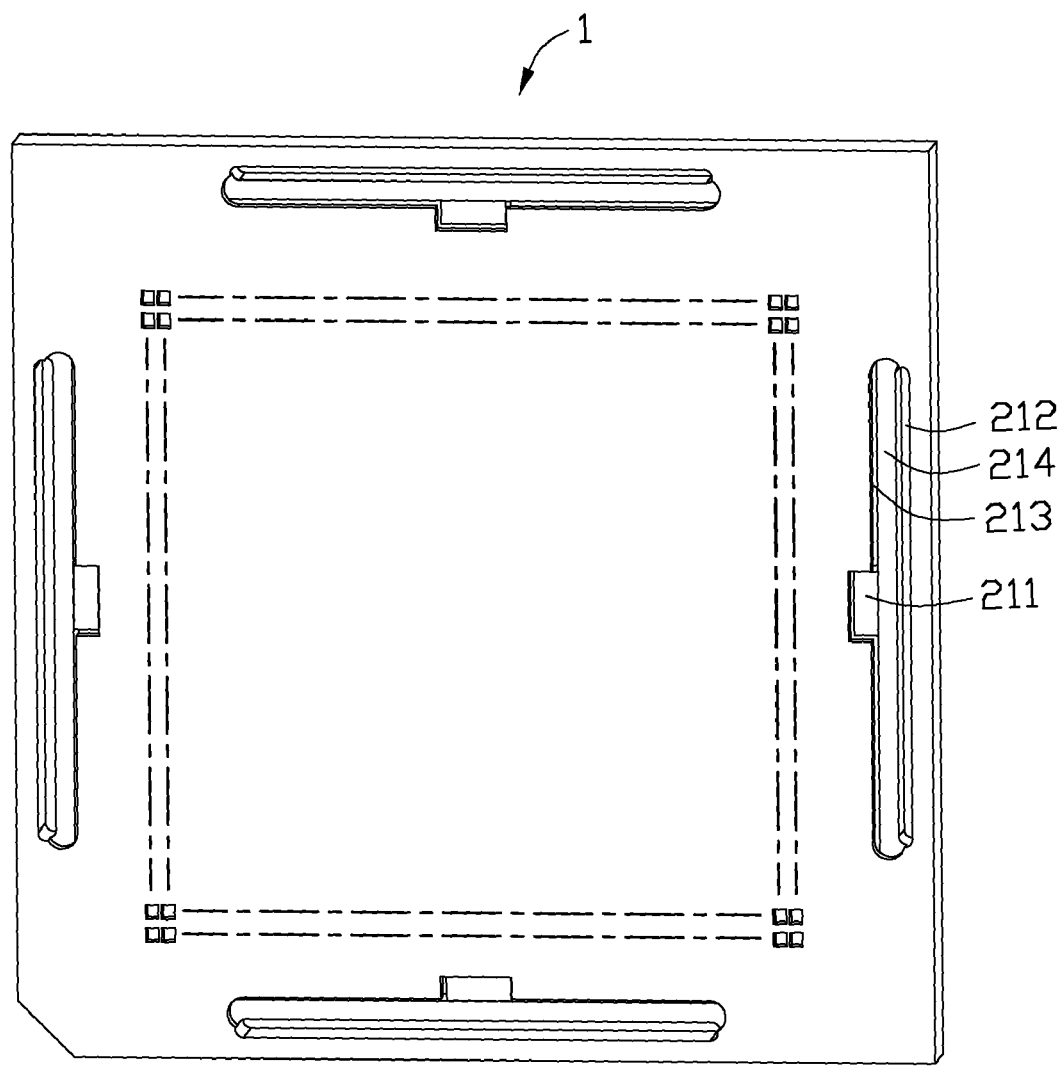
FIG. 4 is a bottom view of the socket connector shown in FIG. 1.
Figure 5:
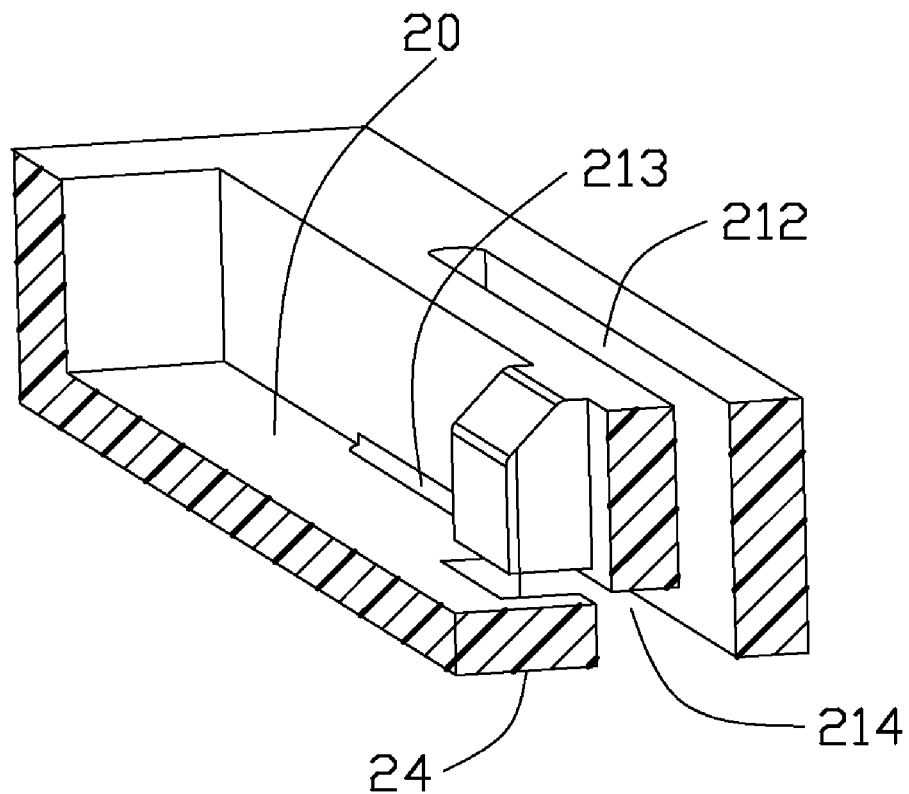
FIG. 5 is a perspective cross-sectional view of the socket connector taken along line 5-5 of FIG. 2.
Figure 6:
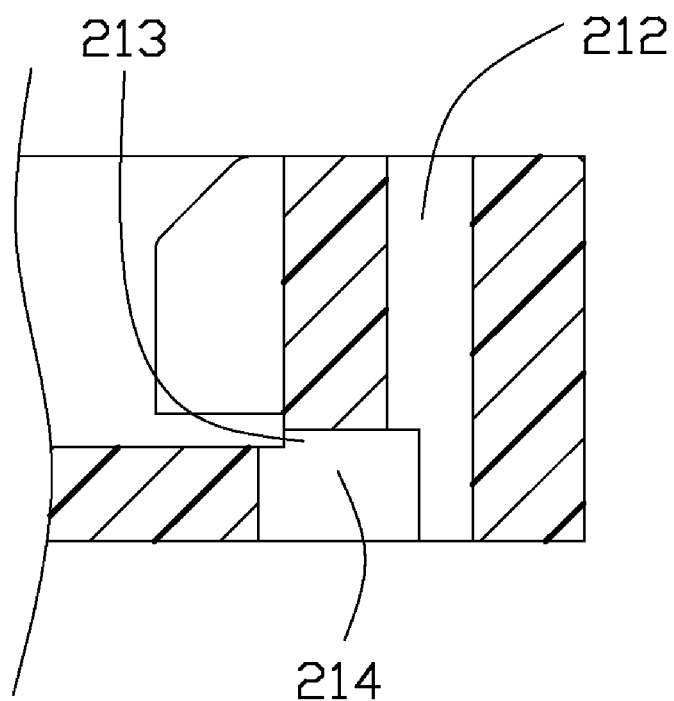
FIG. 6 is a side view of the socket connector shown in FIG. 5.

Referring to FIGS. 1-6, a socket connector 1 made in accordance to a preferred embodiment of the present invention is shown, which is generally used to be mounted onto a mother board (not shown) for receiving an IC package 4 therein. The socket connector 1 includes an insulative and rectangular socket body 2, and a plurality of contact terminals 3 received in the socket body 2. The socket body 2 includes an upper surface 20, a lower surface 24 (as shown in FIG. 5) opposite to the upper surface 20 and four sidewalls 21 surrounding the upper surface 20. The upper surface 20 and sidewalls 21 jointly define a cavity 23 for receiving the IC package 4.

Each sidewall 21 is provided with a resilient arm 210 which is integrally formed from the sidewall 21. A fool-proof section 22 is formed at a crossing area of two adjacent sidewalls 21. The resilient arm 210 has two ends connected to the sidewall 21 and therefore defines a close-loop/first slot 212 therebehind. The first slot 212 extends through the sidewall 21 along an up-to-bottom direction. As shown in FIGS. 2 and 4-6, a plurality of slits 213 are formed at the joints/boundaries of each sidewall 21 and the socket body 2 along a transverse direction perpendicular to the up-to-bottom direction. Each slit 213 is in communication with corresponding first slot 212 so as to release the resilient arm 210 to be back and forth deflectable along the transverse direction. Besides, a plurality of second slots 214 are formed and located under the slits 213, and the second slots 214 penetrate the lower surface 24 of the socket body 2. At the same side of the cavity 23, each of the slits 213 communicates with the corresponding second slot 214 and the corresponding first slot 212, as a result that the slits 213 together with the first slot 212 and the second slot 214 can be formed via eject molding. With the slits 213 formed at the boundary of corresponding upper surface 20 and inner surfaces of the sidewalls 21, the resilient arms 210 can be provided with relative larger height along the up-to-bottom direction to make the resilient arms 210 with reasonable elasticity and rigidity. Besides, the length of the slit 213 is equal to that of the first slot 212 so that the elasticity and rigidity of the resilient arm 210 can be well balanced. Each resilient arm 210 is integrally formed with a positioning member 211 substantially located at a middle position thereof and extending toward the cavity 23. The positioning member 211 further includes an engaging face 2111 that directly engages one edge of the IC package 4 and an inclined guiding face 2110 above the engaging face 2111 for guiding the IC package 4.

When the IC package 4 is placed into the cavity 23, the resilient arms 210 deflect and the position members 211 move outwardly. The engaging faces 2111 engage the edges of the IC package 4 and respectively keeps parallel to the corresponding edge of the IC package 4. The resilient arms 210 apply downward depressing forces onto the IC package 4 due to defection thereof, such that the IC package 4 is securely retained in the cavity 23.

As the resilient arm 210 has two ends associated with the sidewall 21, instead of a cantilevered manner employed in prior art, the resilient arm 210 therefore has a robust intensity and elasticity and breakage thereof is eliminated.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A socket connector, comprising:
   a socket body comprising an upper surface, a lower surface opposite to the upper surface and a plurality of sidewalls extending upwardly from the upper surface along a vertical direction, the upper surface and the sidewalls jointly defining a cavity for receiving an IC package, at least one of the sidewalls being provided with a resilient arm having two ends connected to the sidewall and a close-loop slot behind the resilient arm, the resilient arm being provided with a positioning member extending toward the cavity; and
   a plurality of contact terminals received in the socket body; wherein
   the at least one of the sidewalls defines a lower slot extending downwardly through the lower surface under condition that the lower slot is located under and in communication with the close-loop slot.

2. The socket connector as claimed in claim 1, wherein the positioning member is located at a substantially middle position of both the resilient arm and the sidewall.

3. The socket connector as claimed in claim 1, wherein the socket body has a rectangular shape with four said sidewalls, and each sidewall is provided with one said resilient arm.

4. The socket connector as claimed in claim 1, wherein the positioning member has a planar engaging face directly engaging with an edge of the IC package.

5. The socket connector as claimed in claim 4, wherein the planar engaging face keeps parallel to the edge of the IC package when the resilient arm deflects, and the positioning member has an inclined guiding face above the engaging face.

6. The socket connector as claimed in claim 1, wherein the socket body defines a slit at a joint of the upper surface and the at least one of the sidewalls, the slit extending along a transverse direction perpendicular to the vertical direction, the slit being in communication with the close-loop slot and the lower slot.

7. The socket connector as claimed in claim 6, wherein the lower slot is wider than the close-loop slot as viewed along the vertical direction.

8. The electrical connector assembly as claimed in claim 6, wherein the length of the slit is equal to that of the first slot.

9. A socket connector comprising:
   an insulative socket body comprising a horizontal-expanding base with an upper surface thereon, and a plurality of sidewalls extending, along a vertical direction, upwardly from a periphery of the upper surface, the upper surface and the sidewalls jointly defining a cavity for receiving an IC package therein, each sidewall defining a top surface, an inner surface transversely exposed to the cavity, and a slot extending through the top surface along the vertical direction so as to form an inner arm confronting the cavity; and
   a plurality of contact terminals fixed in the insulative socket body, each contact terminal comprising a contacting section extending beyond the upper surface into the cavity; wherein
   (i) the insulative socket body defines a plurality of slits each of which is formed at a boundary of the inner surface and the upper surface, each slit extending along a transverse direction perpendicular to the vertical direction, each slit being in communication with corresponding slot so as to release each inner arm to be back and forth deflectable along the transverse direction; and
   (ii) each sidewall comprises a positioning member located at a middle point of the inner arm and a middle point of the sidewall as well.

10. The socket connector as claimed in claim 9, wherein linear length of each slit along a front-to-back direction perpendicular to both the transverse direction and the vertical direction is essentially the same as that of the adjacent slot.

11. The socket connector as claimed in claim 9, wherein each positioning member terminates at corresponding boundary of the inner surface and the upper surface, and each slit comprises a U-shaped slit configured to flank the positioning member as viewed along the vertical direction, the U-shaped slit being situated under the positioning member.

12. The socket connector as claimed in claim 9, wherein each positioning member unitarily extends from the inner surface of the inner arm.

13. The socket connector as claimed in claim 9, wherein each sidewall defines a bottom surface opposite to the top surface and a second slot extending through the bottom surface, under condition that at a same side of the cavity, the first slot, the slit and the second slot are in communication with each other.

14. An electrical connector assembly comprising:
   an insulative socket body defining a horizontal base with an upper surface thereon, and a plurality of sidewalls extending, in a vertical direction, upwardly from a periphery of the upper surface and cooperating with said upper surface to commonly define a cavity for receiving an IC (Integrated Circuit) package; and
   at least one of said sidewalls defining a resilient arm located on an inner side and confronting the cavity and back and forth deflectable in a transverse direction perpendicular to said vertical direction, a first slot located beside said resilient arm opposite to the cavity and extending through a top face of said at least one of the sidewalls for communicating with an exterior upwardly, and a second slot located under the resilient arm and communicating with the exterior downwardly in said vertical direction and communicating with the first slot; wherein
   said resilient arm is essentially fully located above the upper surface in said vertical direction.

15. The electrical connector assembly as claimed in claim 14, wherein said resilient arm is equipped with a positioning member unitarily extending from an inner surface of the resilient arm and into the cavity, and said positioning member is essentially located at a middle point of said resilient arm.

16. The electrical connector assembly as claimed in claim 15, wherein said second slot forms a configuration compliant with the positioning member in said vertical direction.

17. The electrical connector assembly as claimed in claim 16, wherein two opposite ends of the resilient arm are unitarily linked with said at least one sidewalls so as to assure symmetrical deflection of said resilient arm thereof during loading the IC package.

18. The electrical connector assembly as claimed in claim 14, wherein a dimension of said resilient arm in the vertical direction is essentially around two thirds of a thickness of the whole socket body.

19. The electrical connector assembly as claimed in claim 14, further comprising a slit formed at a joint of the sidewall and the base along a horizontal direction perpendicular to the vertical direction, and the slit communicates with the first slot and the second slot.

20. The electrical connector assembly as claimed in claim 19, wherein the length of the slit is equal to that of the first slot.

* * * * *